US009852876B2

(12) United States Patent
Kato et al.

(10) Patent No.: US 9,852,876 B2
(45) Date of Patent: Dec. 26, 2017

(54) MULTI CHARGED PARTICLE BEAM WRITING APPARATUS AND MULTI CHARGED PARTICLE BEAM WRITING METHOD

(71) Applicant: NuFlare Technology, Inc., Yokohama-shi (JP)

(72) Inventors: Yasuo Kato, Yokohama (JP); Hideo Inoue, Miura-gun (JP); Hiroshi Matsumoto, Yokohama (JP); Ryoh Kawana, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/423,013

(22) Filed: Feb. 2, 2017

(65) Prior Publication Data

US 2017/0229280 A1 Aug. 10, 2017

(30) Foreign Application Priority Data

Feb. 8, 2016 (JP) .................................. 2016-022040
Apr. 18, 2016 (JP) .................................. 2016-083002

(51) Int. Cl.
*H01J 37/00* (2006.01)
*H01J 37/147* (2006.01)
(Continued)

(52) U.S. Cl.
CPC .......... *H01J 37/147* (2013.01); *H01J 37/045* (2013.01); *H01J 37/20* (2013.01); *H01J 37/304* (2013.01);
(Continued)

(58) Field of Classification Search
CPC ........ H01J 37/147; H01J 37/045; H01J 37/20; H01J 37/3177; H01J 37/304;
(Continued)

(56) References Cited

U.S. PATENT DOCUMENTS 8,222,621 B2    7/2012 Fragner et al.
2016/0155609 A1*  6/2016 Hara ................... H01J 37/3026
                                    250/492.22

FOREIGN PATENT DOCUMENTS

JP    2006-251207    9/2006
JP       5270891     8/2013
(Continued)

*Primary Examiner* — Michael Maskell
(74) *Attorney, Agent, or Firm* — Oblon, McClelland, Maier & Neustadt, L.L.P.

(57) ABSTRACT

In one embodiment, a multi charged particle beam writing apparatus includes processing circuitry that is programmed to perform the function of a data region determination part determining a data region based on boundaries of pixels obtained by dividing a writing area of a substrate into mesh-shaped regions, an irradiation range of multiple charged particle beams, and boundaries of stripe segments obtained by dividing the writing area into segments having a predetermined width such that the segments are arranged in a predetermined direction, a deflection coordinate adjustment part adjusting deflection coordinates of the multiple charged particle beams such that the boundaries of the pixels are mapped to a boundary of the irradiation range, and a correction part calculating a corrected dose of each beam of the multiple charged particle beams by distributing, based on a positional relationship between the beam and pixels in the data region, a dose of the beam corresponding to a pixel in the data region calculated based on write data to one or more beams, and adding doses distributed to the beam, and a writing mechanism, including a charged particle beam source, a deflector, and a stage on which a target object is placed, and the writing mechanism deflecting the multiple charged particle beams based on the adjusted deflection coordinates and applying the beams each having the corrected dose to write a pattern.

16 Claims, 11 Drawing Sheets

(51) Int. Cl.
*H01J 37/317* (2006.01)
*H01J 37/20* (2006.01)
*H01J 37/04* (2006.01)
*H01J 37/304* (2006.01)

(52) U.S. Cl.
CPC ... *H01J 37/3177* (2013.01); *H01J 2237/0435* (2013.01); *H01J 2237/202* (2013.01); *H01J 2237/31774* (2013.01)

(58) Field of Classification Search
CPC ....... H01J 2237/202; H01J 2237/31774; H01J 2237/0435
USPC .......................................... 250/492.1–492.3
See application file for complete search history.

(56) References Cited

FOREIGN PATENT DOCUMENTS

| | | |
|---|---|---|
| JP | 2015-162504 | 9/2015 |
| JP | 5801289 | 10/2015 |
| JP | 2015-228471 | 12/2015 |
| JP | 2016-119423 | 6/2016 |

* cited by examiner

BEFORE ADJUSTMENT
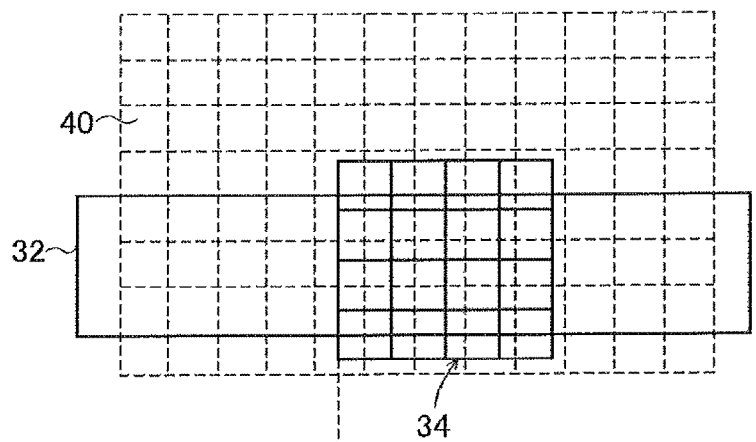
ADJUST CORDINATE
FIG. 11
AFTER ADJUSTMENT
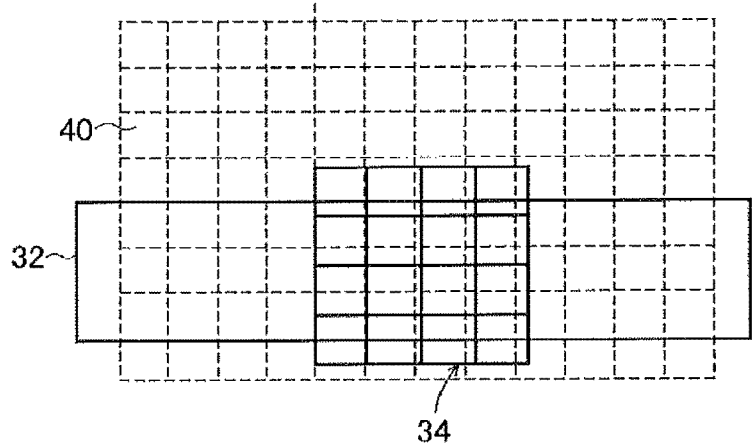

MULTI CHARGED PARTICLE BEAM WRITING APPARATUS AND MULTI CHARGED PARTICLE BEAM WRITING METHOD

CROSS REFERENCE TO RELATED APPLICATION

This application is based upon and claims benefit of priority from the Japanese Patent Application No. 2016-22040, filed on Feb. 8, 2016, and the Japanese Patent Application No. 2016-83002, filed on Apr. 18, 2016, the entire contents of which are incorporated herein by reference.

FIELD

The present invention relates to a multi charged particle beam writing apparatus and a multi charged particle beam writing method.

BACKGROUND

As LSI circuits are increasing in density, circuit line widths of semiconductor devices are becoming finer. Examples of methods of producing an exposure mask (also called a reticle, which is used in a stepper or a scanner) to be used to form a circuit pattern for such a semiconductor device include an electron beam writing technique with high resolution.

A writing apparatus using multiple beams enables irradiation with many beams at once (in a single shot) as compared with writing with a single electron beam, and thus markedly increases throughput. In such a multi-beam writing apparatus, for example, an electron beam emitted downwardly from an electron gun passes through an aperture member having a plurality of holes, thus forming multiple beams.

In these multi-beam writing apparatuses, for example, an attachment positional deviation of an aperture member or a dimensional deviation of holes arranged in the aperture member may cause a shot size to vary from writing adjustment to writing adjustment or from apparatus to apparatus. If writing is performed out of consideration of a variation in shot size, the whole of a layout design will be enlarged or reduced and the accuracy with which patterns are connected will be reduced, leading to a reduction in writing accuracy.

BRIEF DESCRIPTION OF THE DRAWINGS

FIG. 11 is a diagram illustrating exemplary adjustment of deflection coordinates.

DETAILED DESCRIPTION

In one embodiment, a multi charged particle beam writing apparatus includes processing circuitry that is programmed to perform the function of a data region determination part determining a data region based on boundaries of pixels obtained by dividing a writing area of a substrate into mesh-shaped regions, an irradiation range of multiple charged particle beams, and boundaries of stripe segments obtained by dividing the writing area into segments having a predetermined width such that the segments are arranged in a predetermined direction, a deflection coordinate adjustment part adjusting deflection coordinates of the multiple charged particle beams such that the boundaries of the pixels are mapped to a boundary of the irradiation range, and a correction part calculating a corrected dose of each beam of the multiple charged particle beams by distributing, based on a positional relationship between the beam and pixels in the data region, a dose of the beam corresponding to a pixel in the data region calculated based on write data to one or more beams, and adding doses distributed to the beam, and a writing mechanism, including a charged particle beam source, a deflector, and a stage on which a target object is placed, and the writing mechanism deflecting the multiple charged particle beams based on the adjusted deflection coordinates and applying the beams each having the corrected dose to write a pattern.

In an embodiment, a configuration using an electron beam as an example of a charged particle beam will be described. The charged particle beam is not limited to the electron beam. For example, a beam including charged particles, such as an ion beam, may be used.

Figure 1:
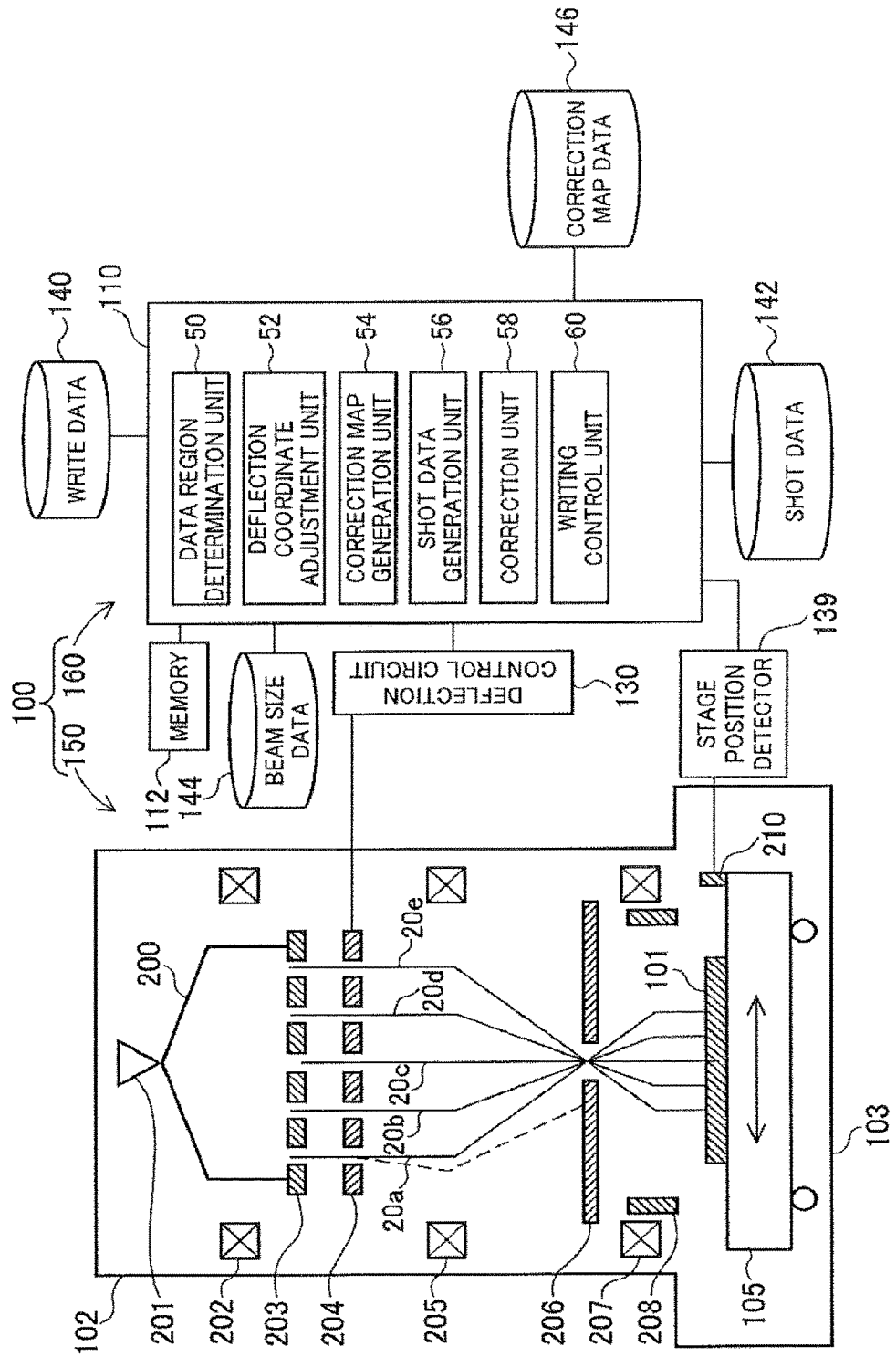
FIG. 1 is a schematic diagram illustrating the configuration of a writing apparatus according to an embodiment of the present invention.

FIG. 1 is a schematic diagram illustrating the configuration of a writing apparatus according to the embodiment. In FIG. 1, a writing apparatus 100 includes a writing unit 150 and a control unit 160. The writing apparatus 100 is an example of a multi charged particle beam writing apparatus.

The writing unit 150 includes an electron optical column 102 and a writing chamber 103. The electron optical column 102 accommodates an electron gun 201, an illumination lens 202, an aperture member 203, a blanking plate 204, a reduction lens 205, a limiting aperture member 206, an objective lens 207, and a deflector 208.

The writing chamber 103 accommodates an XY stage 105, which is continuously movable. A mask substrate 101, serving as a writing target when writing is performed, is placed on the XY stage 105. Examples of the mask substrate 101 include an exposure mask used to fabricate a semiconductor device and a semiconductor substrate (silicon wafer)

on which semiconductor devices are to be fabricated. In addition, examples of the mask substrate 101 include mask blanks that are coated with resist and that have not yet been subjected to writing. Furthermore, a mirror 210 for determining the position of the XY stage 105 is disposed on the XY stage 105.

The control unit 160 includes a control computer 110, a memory 112, a deflection control circuit 130, a stage position detector 139, and storage units 140, 142, 144, and 146, such as magnetic disk units. These components are connected by a bus. Write data from an external device is input to and stored in the storage unit 140.

The control computer 110 includes a data region determination unit 50, a deflection coordinate adjustment unit 52, a correction map generation unit 54, a shot data generation unit 56, a correction unit 58, and a writing control unit 60. Functions of these units may be implemented by hardware, such as electric circuits, or software. In the case where the functions of the units are implemented by software, a program that achieves at least some of the functions may be stored in a recording medium and a computer including a CPU may read and execute the program. Examples of recording media include, but are not limited to, removable recording media, such as a magnetic disk and an optical disk, and fixed recording media, such as a hard disk unit and a memory. Information indicating, for example, a calculation result in the control computer 110 is stored into the memory 112 each time calculation is performed.

Figure 2A:
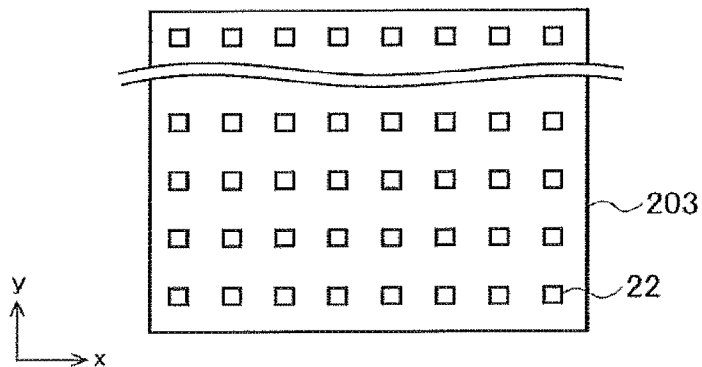
FIGS. 2A and 2B are diagrams each illustrating an exemplary configuration of an aperture member.
Figure 2B:
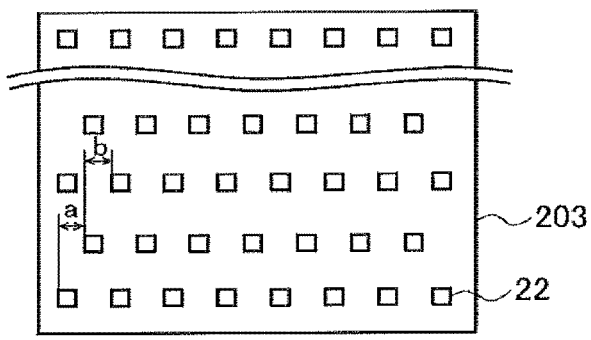

FIGS. 2A and 2B are schematic diagrams each illustrating an exemplary configuration of the aperture member 203. Referring to FIG. 2A, the aperture member 203 has holes (apertures) 22 arranged in a matrix of m columns extending in a longitudinal direction (y direction) of the member×n rows extending in a lateral direction (x direction) thereof (m, n≥2) at a predetermined pitch. For example, the aperture member 203 has the holes 22 arranged in a matrix of 512 columns in the longitudinal direction (y direction)×512 rows in the lateral direction (x direction). The holes 22 are rectangular and have the same dimensions. The holes 22 may be circular.

An electron beam 200 partially passes through these holes 22, thus forming multiple beams 20a to 20e. In the above-described arrangement of the holes 22, both the number of columns in the longitudinal direction (y direction) and the number of rows in the lateral direction (x direction) are two or more. The arrangement is not limited to this example. For example, one of the number of columns in the longitudinal direction (y direction) and the number of rows in the lateral direction (x direction) may be two or more and the other of the number of columns and the number of rows may be one.

The arrangement of the holes 22 is not limited to the matrix as illustrated in FIG. 2A. For example, as illustrated in FIG. 2B, the holes in the kth column in the longitudinal direction (y direction) may be misaligned relative to the holes in the (k+1)th column by a dimension a in the lateral direction (x direction). Similarly, the holes in the (k+1)th column in the longitudinal direction (y direction) may be misaligned relative to the holes in the (k+2)th column by a dimension b in the lateral direction (x direction).

The blanking plate 204 has passage holes (apertures) aligned with the holes 22 of the aperture member 203 illustrated in FIG. 2A or 2B, such that the multiple beams pass through the respective passage holes. Two electrodes paired (a blanker: a blanking deflector) for blanking deflection are arranged so as to face each other in each passage hole. The deflection control circuit 130 applies a deflection voltage based on a control signal to one of the two electrodes. The other of the two electrodes is grounded.

Each of the electron beams 20a to 20e passing through the passage holes can be independently deflected by the blankers, thus achieving blanking control. Each of the blankers performs blanking deflection on a corresponding one of the multiple beams passed through the holes 22 (apertures) of the aperture member 203.

Figure 3:
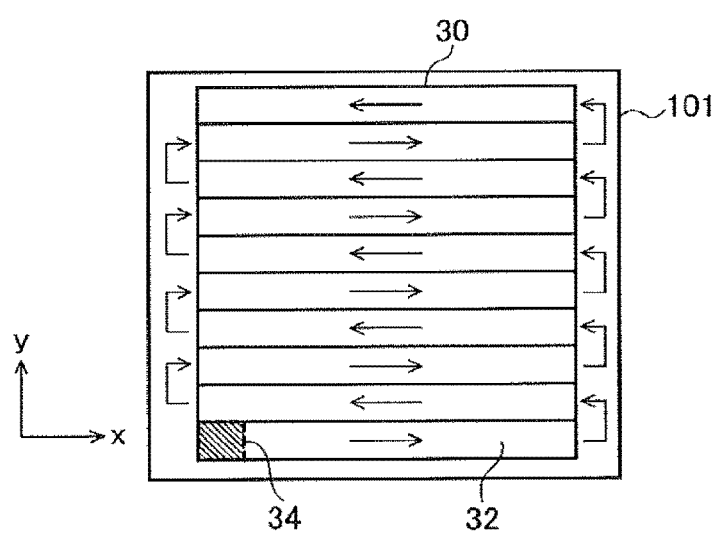
FIG. 3 is a diagram explaining an exemplary writing operation.

FIG. 3 is a schematic diagram explaining an exemplary writing operation. As illustrated in FIG. 3, a writing area 30 of the mask substrate 101 is virtually divided into a plurality of stripe segments 32 that are strip-shaped parts having a predetermined width arranged in, for example, the y direction.

First, the XY stage 105 is moved and adjusted such that an irradiation range 34, which can be irradiated with one-time irradiation of the multiple beams 20, is located at the left end of the first stripe segment 32 or at a position to the left of the left end thereof. Then, writing is started. In writing on the first stripe segment 32, the XY stage 105 is moved in, for example, the −x direction, such that writing is relatively performed in the x direction. The XY stage 105 is continuously moved at a predetermined speed.

Upon writing on the first stripe segment 32, the stage is moved in the −y direction and the position of the stage is adjusted such that the irradiation range 34 is relatively positioned in the y direction and is located at the right end of the second stripe segment 32 or at a position to the right of the right end thereof. The XY stage 105 is then moved in, for example, the x direction such that writing is similarly performed in the −x direction.

Writing is performed in a zigzag manner such that writing is performed on the third stripe segment 32 in the x direction and writing is performed on the fourth stripe segment 32 in the −x direction. This results in a reduction in writing time. The manner of writing is not limited to the above-described zigzag manner. In writing on the stripe segments 32, writing may be performed in the same direction. In one shot, the multiple beams formed by passing through the holes 22 of the aperture member 203 allow up to a plurality of shot patterns equal in number to the holes 22 to be formed at once.

Figure 4:
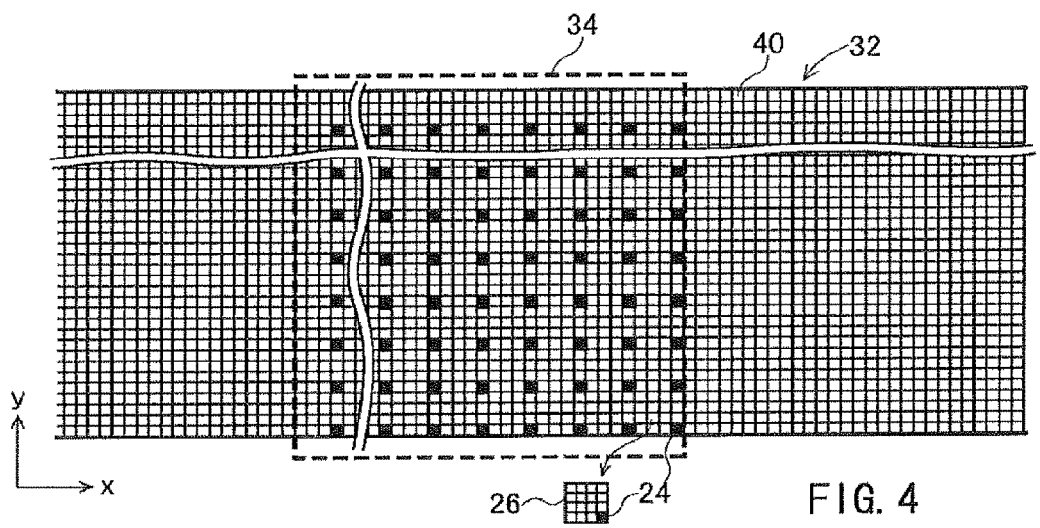
FIG. 4 is a diagram illustrating an exemplary multi-beam irradiation range and exemplary writing target pixels.

FIG. 4 is a diagram illustrating an exemplary multi-beam irradiation range and exemplary writing target pixels. In FIG. 4, the stripe segment 32 is divided into, for example, a plurality of mesh-shaped regions, or mesh regions 40 each having a beam size identical to that of each of the multiple beams. Each mesh region 40 corresponds to a writing target pixel (writing position). The size of each writing target pixel is not limited to the beam size. For example, the size of the writing target pixel may be 1/n (n is an integer greater than or equal to 1) of the beam size. FIG. 4 illustrates a case where the writing area of the mask substrate 101 is divided into a plurality of stripe segments 32 arranged in, for example, the y direction such that the stripe segments 32 each have a width smaller than the size (shot size) of the irradiation range 34, which can be irradiated with one-time irradiation of the multiple beams 20a to 20e. The stripe segments 32 may have any other width. For example, the width of the stripe segments 32 may be n times (n is an integer greater than or equal to 1) as large as the irradiation range 34.

In the irradiation range 34, a plurality of pixels 24 (beam writing positions) that can be irradiated with one-time irradiation of the multiple beams 20a to 20e are illustrated. In other words, a pitch between two adjacent pixels 24 corresponds to a pitch between two adjacent beams of the multiple beams. In the case of FIG. 4, four adjacent pixels 24 define one sub-pitch region 26 such that the sub-pitch region 26 has a square shape and includes one of the four pixels 24. FIG. 4 illustrates the sub-pitch regions 26 each composed of 4×4 pixels.

An operation of the writing unit 150 will now be described. The illumination lens 202 allows the electron beam 200 emitted from the electron gun 201 (emitting unit) to be applied substantially perpendicular to the entirety of the aperture member 203. The electron beam 200 passes through the holes 22 of the aperture member 203, thus forming multiple electron beams (multiple beams) 20a to 20e each having a rectangular shape in cross-section, for example. Each of the multiple beams 20a to 20e passes through the corresponding one of the blankers of the blanking plate 204. Each of the blankers individually deflects (or performs blanking deflection on) the passing electron beam 20 such that the electron beam is in a beam ON state for a writing time (irradiation time) calculated and the electron beam is in a beam OFF state during a period other than the writing time.

The multiple beams 20a to 20e passed through the blanking plate 204 are reduced by the reduction lens 205 and travel toward a central hole of the limiting aperture member 206. The electron beams deflected in the beam OFF state by the blankers of the blanking plate 204 are deviated from the central hole of the limiting aperture member 206 (blanking aperture member) and are thus interrupted by the limiting aperture member 206. In contrast, the electron beams that have not been deflected by the blankers of the blanking plate 204 (or deflected in the beam ON state) pass through the central hole of the limiting aperture member 206.

The beams pass through the limiting aperture member 206 for a period between the time when the beams enter the beam ON state and the time when the beams are changed to the beam OFF state, so that beams of one shot are formed. The multiple beams passed through the limiting aperture member 206 are focused by the objective lens 207, thus forming a pattern image reduced at a desired reduction rate. The beams (the whole of the multiple beams 20) are collectively deflected in the same direction by the deflector 208 and are then applied at writing positions (irradiation positions) on the mask substrate 101.

While the XY stage 105 is continuously moved, the deflector 208 performs tracking control such that the beam writing positions (irradiation positions) follow the movement of the XY stage 105. The stage position detector 139 emits laser light to the mirror 210 on the XY stage 105. Reflected light is used to determine the position of the XY stage 105. Ideally, the multiple beams applied at once are arranged at a pitch obtained by multiplying the arrangement pitch of the holes of the aperture member 203 by the above-described desired reduction rate.

The writing apparatus 100 performs the writing operation while following the movement of the XY stage 105 in each tracking operation in a raster scanning manner such that the multiple beams, serving as shot beams, are successively and sequentially applied to pixels (the pixels 24 in FIG. 4) while the writing positions are shifted.

Figure 5:
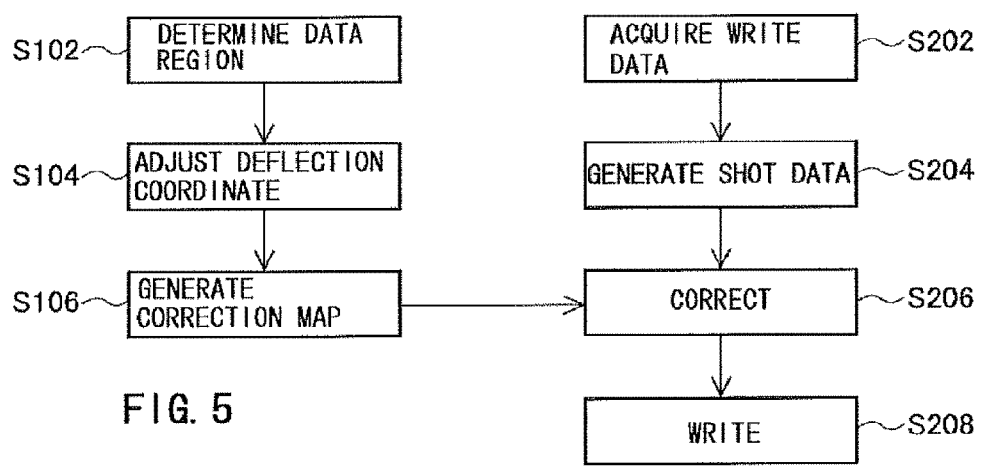
FIG. 5 is a flowchart explaining a writing method according to an embodiment of the present invention.

FIG. 5 is a flowchart explaining a writing method according to an embodiment. The writing method includes a data region determination step S102, a deflection coordinate adjustment step S104, a correction map generation step S106, a write data acquisition step S202, a shot data generation step S204, a correction step S206, and a writing step S208.

In the write data acquisition step S202, the shot data generation unit 56 acquires write data (figure data) by reading the data from the storage unit 140. For example, the shot data generation unit 56 reads write data relevant to each stripe segment from the storage unit 140.

In the shot data generation step S204, the shot data generation unit 56 calculates the surface density of a pattern to be disposed in each pixel (or in each group of pixels) based on the write data. For example, the shot data generation unit 56 allocates a plurality of figure patterns defined in the write data to corresponding pixels. The shot data generation unit 56 then calculates the surface density of a figure pattern to be disposed for each pixel.

In addition, the shot data generation unit 56 calculates a beam dose for each pixel. In this case, an electron beam dose (or irradiation time T, which is also called shot time or exposure time) per shot is calculated for each pixel. It is preferred to obtain a reference dose (or irradiation time T) in proportional to the calculated surface density of a pattern. It is preferred that a finally calculated dose be a corrected dose obtained by correcting a dimensional variation, which would be caused by a dimensional-variation causing phenomenon (not illustrated), such as a proximity effect, a fogging effect, or a loading effect, with a dose. The irradiation time can be defined as a value obtained by dividing a dose D by a current density 3.

The shot data generation unit 56 calculates a dose for each pixel, provided that the beams are reduced at a predetermined reduction rate (for example, 200%). However, for example, an attachment positional deviation of the aperture member 203 or a dimensional deviation of the holes 22 arranged in the aperture member 203 would cause a change in beam reduction rate, leading to a variation in shot size (beam size).

Figure 6:
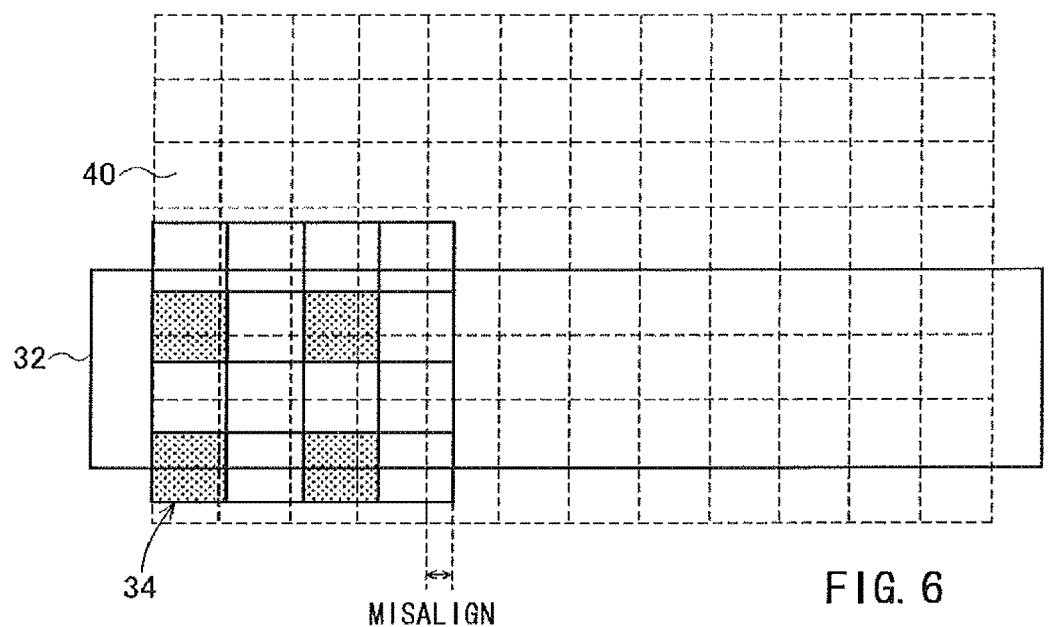
FIG. 6 is a diagram illustrating an irradiation range of multiple beams varied in beam size.

FIG. 6 illustrates an exemplary relationship between the pixels 40 for which the shot data generation unit 56 calculates doses and the irradiation range 34 for multiple beams varied in beam size. The pixels 40 are indicated by dashed lines. FIG. 6 illustrates a case where multiple beams are four beams. As illustrated in FIG. 6, a variation in size of each of the multiple beams causes each beam to be located on a plurality of pixels 40, so that the boundary of the irradiation range 34 is misaligned with boundaries of the pixels 40. It is therefore necessary to correct a dose to each pixel 40 in consideration of a variation in beam size.

Figure 7:
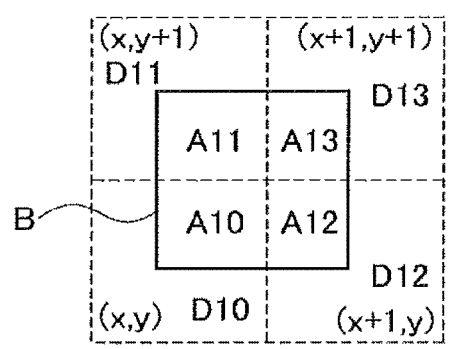
FIG. 7 is a diagram illustrating exemplary dose correction.
Figure 8A:
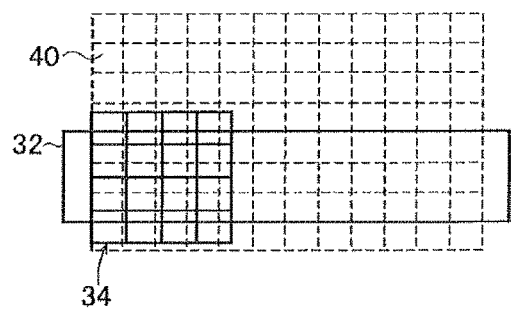
FIGS. 8A to 8D are diagrams illustrating shots in Comparative Example.
Figure 8D:
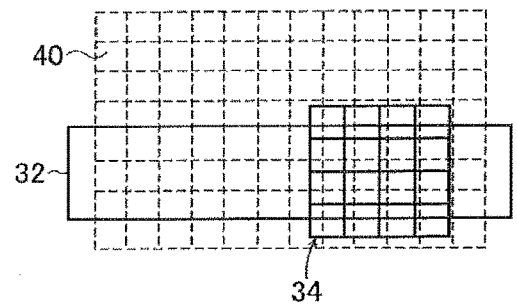
Figure 8B:
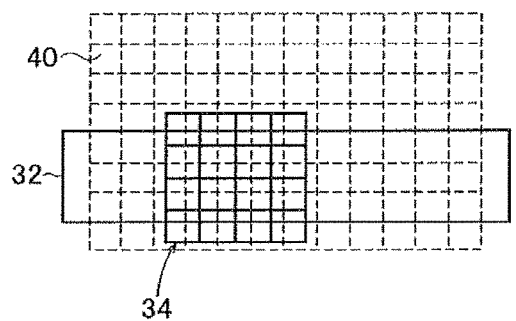
Figure 8C:
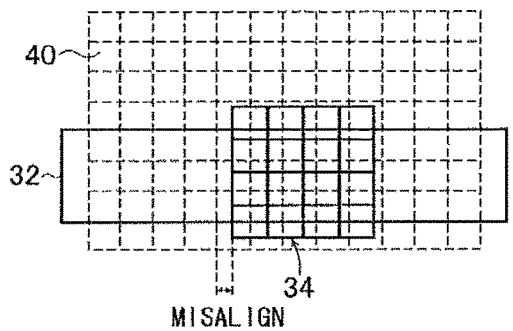

For example, as illustrated in FIG. 7, a beam B corresponding to a pixel at coordinates (x, y) is located on the pixel at the coordinates (x, y) and its neighboring pixels at coordinates (x, y+1), (x+1, y), and (x+1, y+1). A dose to be distributed to the beam B is obtained from a dose to each of these pixels and the proportion of the area of the beam B overlapping each of the pixels, and the doses distributed from the pixels are summed to obtain a corrected dose of the beam B.

For example, let A10 denote the proportion (i.e., the ratio of the overlapped area to the area of one pixel) of the area of the beam B overlapping the pixel at the coordinates (x, y) and let D10 denote a dose to the pixel at the coordinates (x, y). Similarly, let A11, A12, and A13 denote the proportion of the area of the beam B overlapping the pixel at the coordinates (x, y+1), the proportion of the area of the beam B overlapping the pixel at the coordinates (x+1, y), and the proportion of the area of the beam B overlapping the pixel at the coordinates (x+1, y+1), respectively, and let D11, D12, and D13 denote a dose to the pixel at the coordinates (x, y+1), a dose to the pixel at the coordinates (x+1, y), and a dose to the pixel at the coordinates (x+1, y+1), respectively.

In this case, the corrected dose of the beam B is given by D10×A10+D11×A11+D12×A12+D13×A13. A corrected dose of each beam is calculated in the above-described manner.

It is assumed that shots are applied while the irradiation range is shifted by ½ the size of the range. FIGS. 8A to 8D illustrate a case where shots are applied while the irradiation range is simply shifted by ½ the size of the range. The misalignment between the boundary of the irradiation range 34 and the boundaries of the pixels 40 causes the positional relationship between the beams and the pixels 40 to vary in the shots in FIGS. 8A to 8D and also causes the way each beam is located on neighboring pixels 40 to vary in the shots in FIGS. 8A to 8D. The proportions of dose distribution to neighboring pixels vary from shot to shot. In other words, different dose correction maps that define the proportions of dose distribution to neighboring pixels are used in FIGS. 8A to 8D, leading to an increase in calculation cost of correction processing.

Figure 9A:
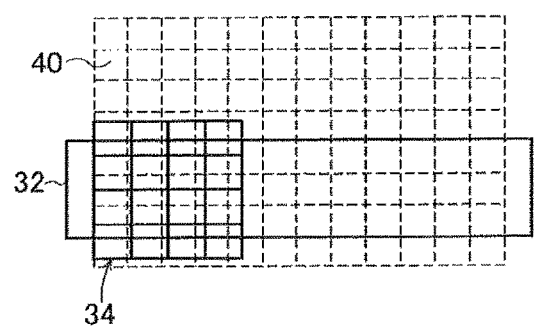
FIGS. 9A to 9D are diagrams illustrating exemplary shots in an embodiment.

In the present embodiment, a shot position (deflection coordinates) is adjusted so that the boundary of the irradiation range 34 is aligned with (mapped to) the boundaries of the pixels 40. FIGS. 9A to 9D illustrate exemplary adjustment of shot positions in the present embodiment. FIGS. 9A and 9B are the same as FIGS. 8A and 8B. In this example, in a shot illustrated in FIG. 9C, the boundary of the irradiation range 34 is aligned with the boundaries of the pixels 40. This position adjustment causes, for example, the end part region in the +x direction of the irradiation range in the shot in FIG. 9A to overlap the end part region in the −x direction of the irradiation range in the shot in FIG. 9C.

Figure 9D:
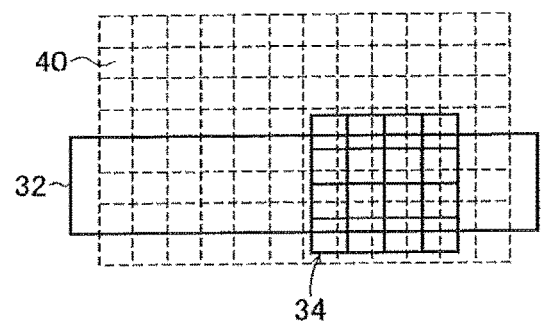
Figure 9B:
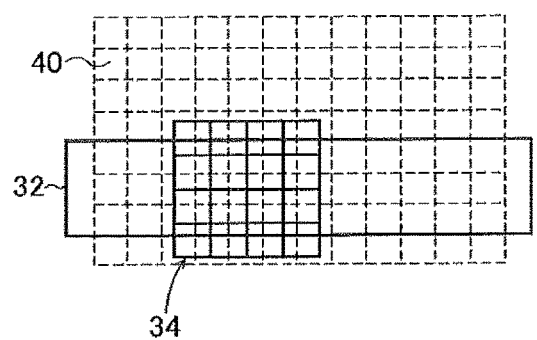
Figure 9C:
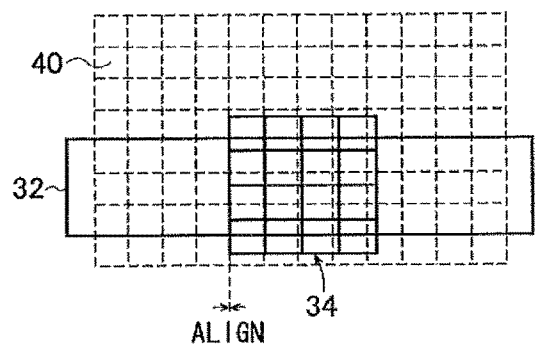

This position adjustment causes the positional relationship between each beam and the pixels 40 (the way each beam is located on neighboring pixels) in FIG. 9C to be identical to that in FIG. 9A, so that the proportions of dose distribution to the neighboring pixels in FIG. 9C are identical to those in FIG. 9A. Thus, a common dose correction map can be used in FIGS. 9A and 9C. Similarly, a common dose correction map can be used in FIGS. 9B and 9D. In other words, once a set of two correction maps, namely, the dose correction map in FIG. 9A and that in FIG. 9B, are generated, these maps can be repeatedly used in the subsequent shots. Since the common correction maps can be repeatedly used, the calculation cost of correction processing can be reduced. The above-described correction map generation is performed in the data region determination step S102, the deflection coordinate adjustment step S104, and the correction map generation step S106.

The data region determination step S102 to the correction map generation step S106 are preferably performed as preprocessing in preparation for a writing process.

In advance of the writing process, beam sizes in pixels are measured when multiple beams are applied to the mask substrate 101, thus obtaining the size of an irradiation range. The size of the irradiation range can be obtained by applying the multiple beams to a measurement substrate (not illustrated) coated with resist placed on the XY stage 105. Beam size data and irradiation range size data are stored into the storage unit 144.

Figure 10:
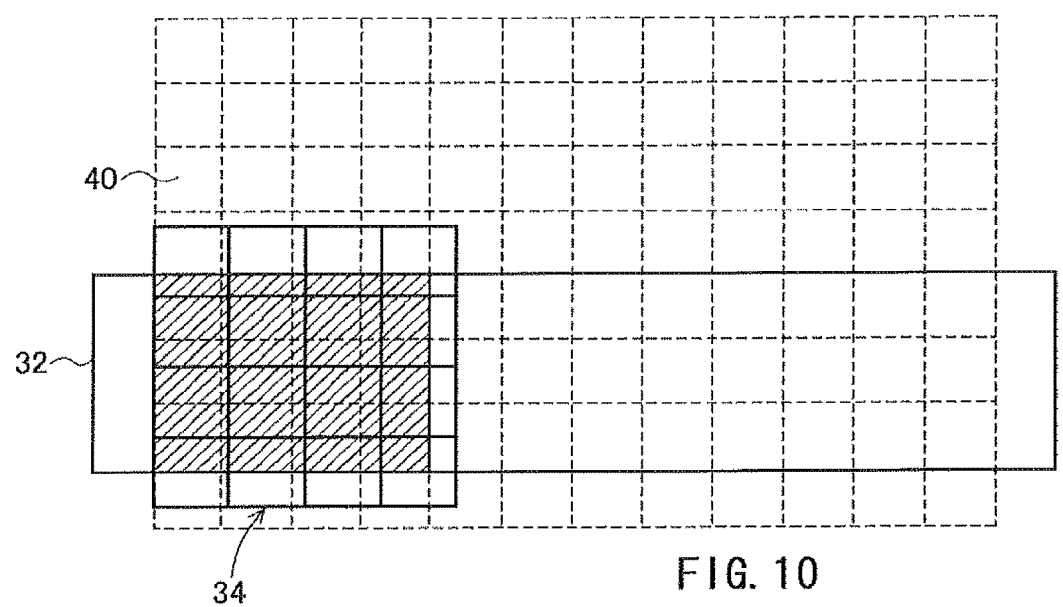
FIG. 10 is a diagram illustrating an exemplary determined data region.

In the data region determination step S102, the data region determination unit 50 determines a data region corresponding to the irradiation range 34 in pixel data based on the irradiation area size data such that, for example, the data region is smaller than an actual irradiation range size within the stripe segment 32 and the boundary of the data region is aligned with (or coincides with) the boundaries of the nearest pixels 40. For example, the data region corresponds to a hatched portion in FIG. 10.

In the deflection coordinate adjustment step S104, the deflection coordinate adjustment unit 52 adjusts deflection coordinates based on the boundary of the data region determined in step S102 such that the boundary of the irradiation range 34 is aligned with the boundaries of the pixels 40. For example, as illustrated in FIG. 11, the deflection coordinates are adjusted in the −x direction.

In the correction map generation step S106, a correction map for distributing a dose to neighboring pixels is generated. To apply a shot while the irradiation range is shifted by ½ the size of the range, two different correction maps are generated. Similarly, to apply a shot while the irradiation range is shifted by ⅓ the size of the range, three different correction maps to be repeatedly used are generated. To apply a shot while the irradiation range is shifted by (one time) the size of the range, one correction map is generated. In this case, multiple types (n types) of correction maps to be repeatedly used are preferably generated as one combined map. A data size of the combined map can be substantially the same as that of one correction map because the number of effective pixels 40 to be irradiated in each shot related to the combined map is 1/n that in the case where a shot is applied while the irradiation range is shifted by (one time) the size of the range. The generated correction map is stored into the storage unit 146.

For example, in the shots illustrated in FIGS. 9B and 9D, the shot position may be adjusted such that the boundary of the irradiation range 34 is aligned with the boundaries of the pixels 40. Consequently, the same positional relationship between each beam and the pixels 40 (the way each beam is located on neighboring pixels) is provided in all of the shots. Thus, a common dose correction map can be used. In the case where shots are applied while the irradiation range is shifted by ⅓ the size of the range, similarly, the shot position for each shot may be adjusted so that a common dose correction map can be used in all of the shots. The boundary of the irradiation range 34 may be aligned with the boundaries of the pixels 40. Alternatively, the shot position may be adjusted so that two different correction maps can be used.

After a correction map is generated as preprocessing as described above, the actual writing process is started. As described above, first, in the write data acquisition step S202, write data is read for each stripe segment from the storage unit 140. Then, in the shot data generation step S204, a beam dose is calculated for each pixel.

Then, in the correction step S206, the correction unit 58 distributes the dose for each pixel to its neighboring pixels based on the proportions of dose distribution defined in the correction map. The correction unit 58 calculates a corrected dose to each pixel (beam) by adding doses distributed from its neighboring pixels. A dose to each pixel is corrected in this manner, thus reconstructing pixel data.

Figure 12:
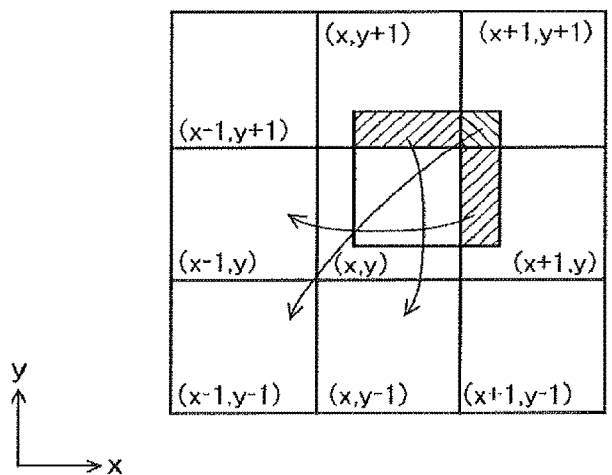
FIG. 12 is a diagram illustrating exemplary dose correction.

Furthermore, after reconstruction of the pixel data, the correction unit 58 may allocate a dose to neighboring pixels to correct a positional deviation or a dimensional deviation of a pattern formed by beams deviated due to, for example, electron beam distortion. For example, as illustrated in FIG. 12, a beam corresponding to a pixel at coordinates (x, y) is located on the pixel at the coordinates (x, y) and its neighboring pixels at coordinates (x, y+1), (x+1, y), and (x+1, y+1). In this case, a dose to the pixel at the coordinates (x, y) is allocated to other neighboring pixels located on the opposite side of the pixel from the pixels overlapped by the beam based on the ratios of the overlapped areas. For example, a dose based on the ratio of the overlapped area of the pixel at the coordinates (x, y+1) is allocated to a pixel at coordinates (x, y−1). Doses allocated from neighboring pixels are added to obtain a corrected dose.

The number of beams corresponding to one pixel is not necessarily limited to one. Two or more beams may correspond to one pixel. Furthermore, the dose of a beam corresponding to one pixel does not necessarily have to be allocated to other beams.

In the writing step S208, the writing unit 150 writes a pattern onto the mask substrate 101 with multiple beams such that a pixel corresponding to each beam is irradiated by a corrected dose. The writing control unit 60 converts each corrected dose into an irradiation time, arranges the irradiation times in the order of shots based on a writing sequence, and outputs irradiation time data to the deflection control circuit 130. The deflection control circuit 130 controls the blankers of the blanking plate 204 and a deflection amount of the deflector 208 for each shot based on the irradiation time data. In addition, the writing control unit 60 outputs data indicating deflection coordinates, adjusted by the deflection coordinate adjustment unit 52, to the deflection control circuit 130. Consequently, the deflection amount of the deflector 208 is controlled such that the boundary of the irradiation range of the multiple beams is aligned with the boundaries of pixels.

As described above, if the beam size varies, doses to pixels are distributed to correct each beam dose, thus preventing a reduction in writing accuracy. In addition, a data region is determined (limited) such that the boundary of the irradiation range 34 is aligned with the boundaries of the pixels 40, and deflection coordinates are adjusted to ensure boundary alignment. Consequently, a common correction map for dose correction can be used in shots, thus reducing the time and resources taken for correction map generation.

In the above-described embodiment, at least one set of correction maps to be repeatedly used may be generated such that a plurality of the sets are provided depending on, for example, global position dependence on the mask substrate 101.

In the above-described embodiment, two correction processes are performed: dose correction to reconstruct pixel data and dose correction to correct a positional deviation or a dimensional deviation of a pattern to be formed. These processes may be collectively performed as one correction process. For example, a corrected dose is calculated so that the area (dose) and the center of gravity in an ideal shot (calculated shot before dose correction) are aligned with those in an actual shot (shot after dose correction).

Figure 13:
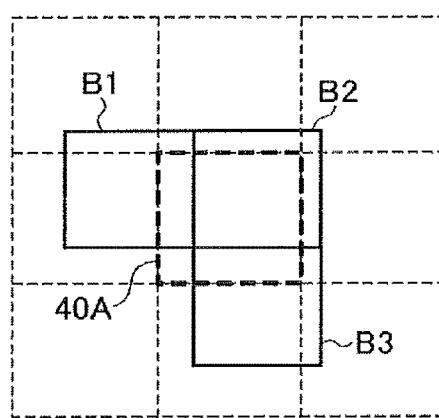
FIG. 13 is a diagram illustrating exemplary dose correction.

The following description will focus on a pixel 40A in FIG. 13. The pixel 40A is overlapped by three beams B1, B2, and B3 deviated due to, for example, a variation in beam size or electron beam distortion. Let $D_1$, $D_2$, and $D_3$ denote the doses of the beams B1, B2, and B3, respectively. A corrected dose D to the pixel 40A is calculated such that the following relational expression holds.

$$D = D_1 + D_2 + D_3$$

$$D\vec{x} = D_1\vec{x}_1 + D_2\vec{x}_2 + D_3\vec{x}_3 \quad \text{[Math. 1]}$$

$\vec{x}$ denotes a gravity center position of the pixel 40A.
$\vec{x}_1$, $\vec{x}_2$, $\vec{x}_3$ are respectively denote gravity center positions of the beams B1, B2, and B3.

For other pixels, expressions similar to the above expression are formulated and corrected doses to the other pixels are calculated such that the expressions hold. As described above, each dose is corrected so that the area (dose) and the center of gravity in the ideal shot are aligned with those in the actual shot, thus correcting a positional deviation or a dimensional deviation of a pattern in addition to reconstructing pixel data.

Figure 14A:
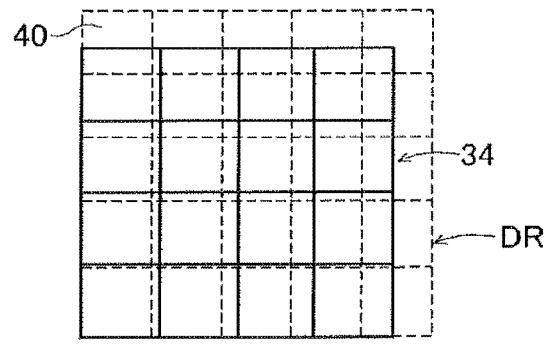
FIGS. 14A to 14C are diagrams explaining a process for a large data region.
Figure 14B:
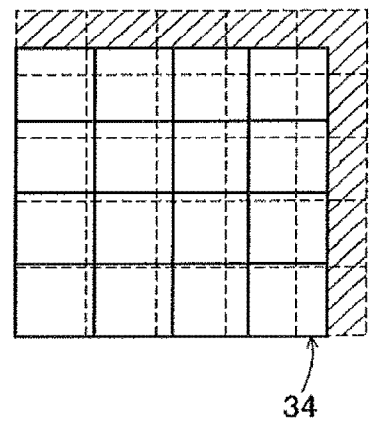
Figure 14C:
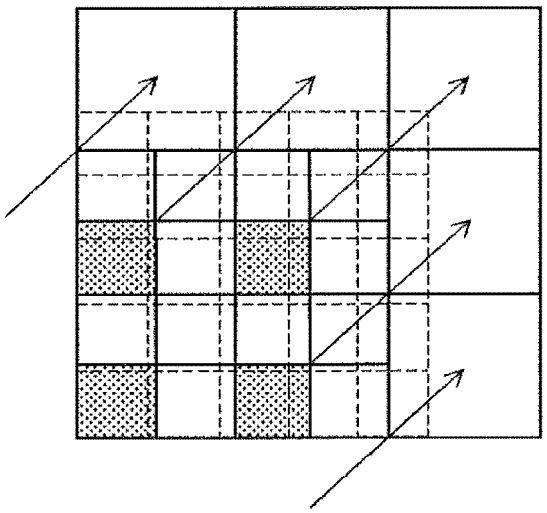

In the data region determination step S102 in the above-described embodiment, the data region determination unit 50 may determine a data region such that the data region is larger than the irradiation range 34. For example, as illustrated in FIG. 14A, a data region DR is determined such that the data region DR is larger than the irradiation range 34 in the +x direction and the +y direction (rightward and upward directions in FIG. 14A). In this case, an additional shot for a boundary portion, illustrated by hatching in FIG. 14B, outwardly extending in the +x and +y directions from the boundary of the irradiation range 34 is needed. The shot data generation unit 56 generates additional shot data (complements shot data) for this boundary portion. For a shot based on the additional shot data, as illustrated in FIG. 14C, beams for a shot to a portion located in the −x direction and the −y direction (lower left portion in FIG. 14C) are used.

Although a correction map is used to correct, for example, doses in the present embodiment, the map does not necessarily have to be used. Correction calculation may be performed by using, for example, a correction expression.

In the above-described embodiment, the sum of doses distributed to one or more beams is not limited to be the same as an original dose before distribution. The sum of doses distributed to other beams may be greater than or less than the original dose before distribution.

The writing apparatus 100 applies beams to the mask substrate 101 on the movable XY stage 105 while performing the tracking operation of causing the beams to follow the moving stage such that target pixels irradiated with the beams are not shifted due to the movement of the XY stage 105 during irradiation with the multiple beams. When one or more shots are completed, the writing apparatus 100 resets the tracking operation to direct the beams back, shifts deflection positions to the next target pixels to be irradiated, and after that, applies the beams to the target pixels while similarly performing the tracking operation.

Figure 15:
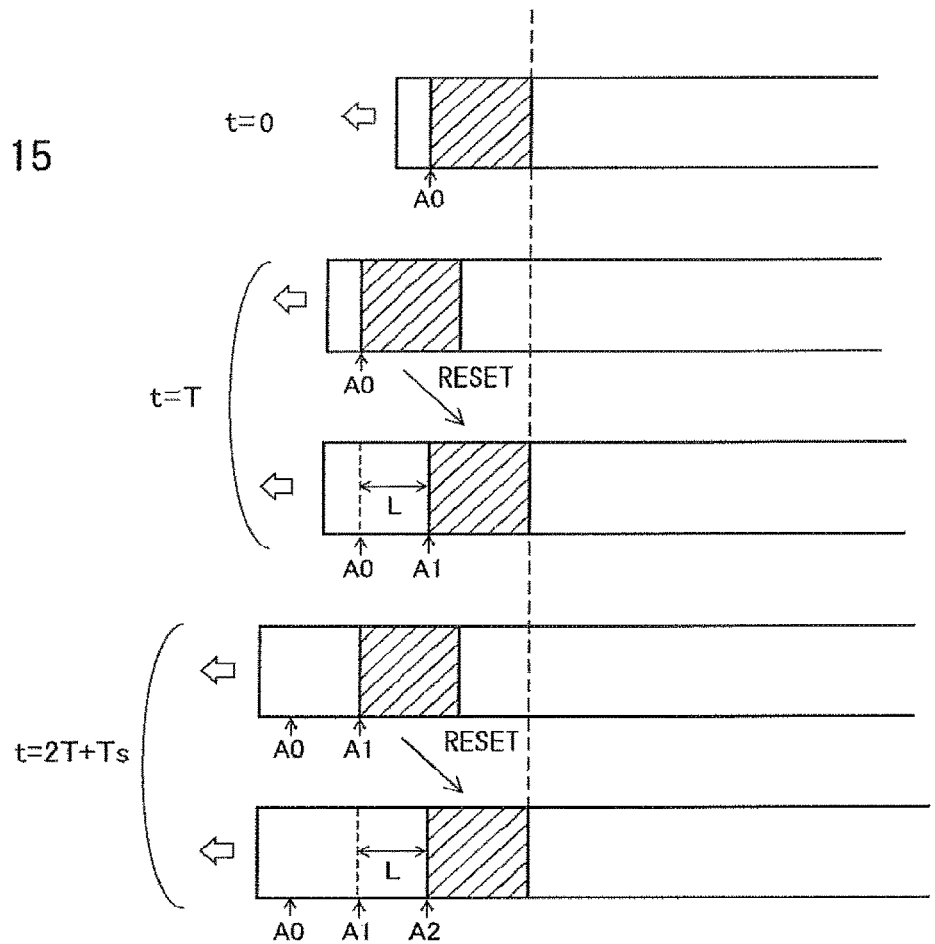
FIG. 15 is a diagram illustrating an exemplary tracking operation.

In traditional tracking control, as illustrated in FIG. 15, tracking with respect to a position A0 on a substrate is continued for a period from time t=0 to time t=T. A stage is moved by a distance L for a period T. Resetting the tracking at time t=T causes the beams to be directed back in a direction opposite to a stage moving direction. After settling time Ts of a DAC amplifier has elapsed, the next tracking with respect to a position A1 is started.

The tracking with respect to the position A1 is continued for a period from time t=T+Ts to time t=2T+Ts. The stage is moved by the distance L for this period. Resetting the tracking at time t=2T+Ts causes the beams to be directed back. After the settling time Ts of the DAC amplifier has elapsed, the next tracking with respect to a position A2 is started. Such an operation is subsequently repeated.

In the traditional tracking operation, the distance between the shots (e.g., the distance between the position A0 and the position A1, the distance between the position A1 and the position A2) is constant and a tracking reset distance (by which the beams are directed back) is also constant. In contrast, since shot positions (deflection coordinates) are adjusted such that the boundary of the irradiation range 34 is aligned with the boundaries of the pixels 40 in the above-described embodiment, the distance between the shots does not have to be constant and the tracking reset distance does not also have to be constant.

The writing apparatus 100 obtains beam deflection coordinates P, adjusted such that the boundary of the irradiation range 34 is aligned with the boundaries of the pixels 40, and corrected doses to determine shot data. The deflection control circuit 130 reads the shot data, calculates a tracking reference position P-L0 from the deflection coordinates P and a stage position L0 at the start of tracking, and starts the tracking operation.

To use the whole of the irradiation range 34 such that a large tracking range is used, an offset term may be added to calculate the tracking reference position P-L0.

Figure 16A:
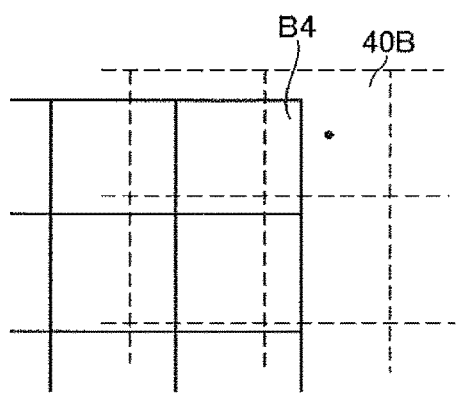
FIGS. 16A and 16B are diagrams each illustrating an exemplary positional relationship between a pixel mesh and a beam mesh.

After adjustment of the deflection coordinates, as illustrated in FIG. 16A, a pixel mesh (indicated by dashed lines) would be significantly misaligned with a beam mesh (indicated by solid lines) such that the center of a pixel 40B is located outside the beam mesh. To apply a beam B4 to the pixel 40B by a desired dose, the dose has to be markedly increased, leading to an increase in writing time per shot. This would significantly affect a total writing time because writing on the mask substrate 101 involves many shots.

Figure 16B:
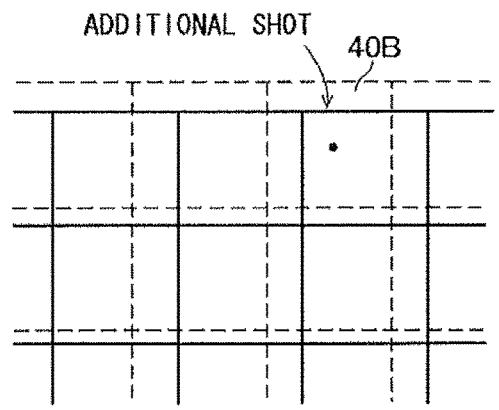

If the pixel mesh is misaligned with the beam mesh by a predetermined amount or more such that, for example, the center of the pixel 40B is located outside the beam mesh, a shot is preferably added such that the center of the pixel 40B is located within the beam mesh as illustrated in FIG. 16B. Rather than extending the writing time per shot, adding one shot contributes to a shorter total writing time.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi charged particle beam writing apparatus comprising:
    processing circuitry that is programmed to perform functions of
    a data region determination part determining a data region based on boundaries of pixels obtained by dividing a writing area of a substrate into mesh-shaped regions, an irradiation range of multiple charged particle beams, and boundaries of stripe segments obtained by dividing the writing area into segments having a predetermined width such that the segments are arranged in a predetermined direction,
    a deflection coordinate adjustment part adjusting deflection coordinates of the multiple charged particle beams such that the boundaries of the pixels are mapped to a boundary of the irradiation range, and
    a correction part calculating a corrected dose of each beam of the multiple charged particle beams by distributing, based on a positional relationship between the beam and pixels in the data region, a dose of the beam corresponding to a pixel in the data region calculated based on write data to one or more beams, and adding doses distributed to the beam; and
    a writing mechanism, including a charged particle beam source, a deflector, and a stage on which a target object is placed, and the writing mechanism deflecting the multiple charged particle beams based on the adjusted deflection coordinates and applying the beams each having the corrected dose to write a pattern.

2. The apparatus according to claim 1, wherein the correction part calculates the corrected dose for each pixel in the data region by using a correction map that defines proportions of distribution of a dose of a beam corresponding to the pixel to surrounding beams.

3. The apparatus according to claim 1, wherein the correction part calculates the corrected dose for each pixel from a center-of-gravity position of the pixel, a dose of a beam corresponding to the pixel, and a center-of-gravity position of the beam.

4. The apparatus according to claim 1, wherein when the data region determination part determines the data region to be larger than the irradiation range of the multiple charged particle beams, shot data corresponding to a portion that is located outside the irradiation range within the data region is added.

5. The apparatus according to claim 1, further comprising:
    a stage on which the substrate is placed, the stage being movable;
    an aperture member having a plurality of apertures through which a charged particle beam passes to form the multiple charged particle beams;
    a blanking plate including a plurality of blankers each switching a corresponding one of the multiple charged particle beams between a beam ON state and a beam OFF state;
    a deflector collectively deflecting beams in the beam ON state provided by the blankers such that the beams follow movement of the stage; and wherein the processing circuitry is programmed to perform the function of
    a deflection control part controlling the deflector to deflect the beams to a first writing position, perform tracking control such that beam irradiation positions follow the movement of the stage while writing is performed for a predetermined time, and reset beam deflection after a lapse of the predetermined time such that the beams are directed back in a direction opposite to a stage moving direction,
    wherein after writing at the first writing position, the deflection control part deflects the beams to a second writing position and performs writing and tracking control and, after writing at the second writing position, deflects the beams to a third writing position and performs writing and tracking control.

6. The apparatus according to claim 5, wherein a distance between the first writing position and the second writing position differs from a distance between the second writing position and the third writing position.

7. The apparatus according to claim 1, wherein when the pixel is misaligned with a beam corresponding to the pixel by a predetermined amount or more, a shot to be applied to the pixel is added.

8. The apparatus according to claim 7, wherein when the pixel has a center located outside a beam corresponding to the pixel, the shot is added.

9. A multi charged particle beam writing method comprising:
    determining a data region based on boundaries of pixels obtained by dividing a writing area of a substrate into mesh-shaped regions, an irradiation range of multiple charged particle beams, and boundaries of stripe segments obtained by dividing the writing area into segments having a predetermined width such that the segments are arranged in a predetermined direction;

adjusting deflection coordinates of the multiple charged particle beams such that the boundaries of the pixels are mapped to a boundary of the irradiation range;

calculating a corrected dose of each beam of the multiple charged particle beams by distributing, based on a positional relationship between the beam and pixels in the data region, a dose of the beam corresponding to a pixel in the data region calculated based on write data to one or more beams, and adding doses distributed to the beam; and deflecting the multiple charged particle beams based on the adjusted deflection coordinates and applying the beams each having the corrected dose to write a pattern.

10. The method according to claim 9, wherein the corrected dose is calculated for each pixel in the data region by using a correction map that defines proportions of distribution of a dose of a beam corresponding to the pixel to surrounding beams.

11. The method according to claim 9, wherein the corrected dose is calculated for each pixel from a center-of-gravity position of the pixel, a dose of a beam corresponding to the pixel, and a center-of-gravity position of the beam.

12. The method according to claim 9, wherein when the data region is larger than the irradiation range of the multiple charged particle beams, shot data corresponding to a portion that is located outside the irradiation range within the data region is added.

13. The method according to claim 9, further comprising:
performing tracking control such that irradiation positions of the multiple charged particle beams follow movement of a stage on which the substrate is placed, and resetting beam deflection after a lapse of a predetermined time such that the beams are directed back in a direction opposite to a stage moving direction, wherein the beams are deflected to a first writing position and writing and tracking control are performed, after writing at the first writing position, the beams are deflected to a second writing position and writing and tracking control are performed, and after writing at the second writing position, the beams are deflected to a third writing position and writing and tracking control are performed.

14. The method according to claim 13, wherein a distance between the first writing position and the second writing position differs from a distance between the second writing position and the third writing position.

15. The method according to claim 9, wherein when the pixel is misaligned with a beam corresponding to the pixel by a predetermined amount or more, a shot to be applied to the pixel is added.

16. The method according to claim 15, wherein when the pixel has a center located outside a beam corresponding to the pixel, the shot is added.

* * * * *